United States Patent
Schultz et al.

[19]

[11] Patent Number: 6,099,059
[45] Date of Patent: Aug. 8, 2000

[54] DEVICE FOR THE TRANSFER OF AN OBJECT BETWEEN AT LEAST TWO LOCATIONS

[75] Inventors: Klaus Schultz, Jena; Volker Weisbach, Apolda; Bernd Gey, Gera; Andreas Mages, Jena, all of Germany

[73] Assignee: Brooks Automation GmbH, Jena, Germany

[21] Appl. No.: 09/158,559

[22] Filed: Sep. 22, 1998

[30] Foreign Application Priority Data

Feb. 16, 1998 [DE] Germany ............ 198 06 231

[51] Int. Cl.⁷ ............ B25J 19/02; B65G 65/00
[52] U.S. Cl. ............ 294/119.1; 294/907; 414/225; 414/940; 901/47
[58] Field of Search ............ 294/119.1, 116, 294/907, 81.62, 67.33; 414/225, 917, 935, 940; 901/46, 47

[56] References Cited

U.S. PATENT DOCUMENTS

| | | | |
|---|---|---|---|
| 4,423,998 | 1/1984 | Inaba et al. | 294/907 |
| 4,591,198 | 5/1986 | Monforte | 901/47 |
| 4,698,775 | 10/1987 | Koch et al. | 901/47 |
| 4,766,322 | 8/1988 | Hashimoto | 901/47 |
| 4,836,733 | 6/1989 | Hertel et al. | |
| 5,425,565 | 6/1995 | Rogovein et al. | 294/119.1 |
| 5,628,604 | 5/1997 | Murata et al. | 414/940 |
| 5,857,848 | 1/1999 | Takahashi et al. | 414/940 |

FOREIGN PATENT DOCUMENTS

| | | |
|---|---|---|
| 0338673 | 3/1989 | European Pat. Off. . |
| 1225358 | 9/1966 | Germany . |
| 4129829 | 3/1993 | Germany . |
| 5-299489 | 11/1993 | Japan ............ 414/940 |
| 84/04723 | 12/1984 | WIPO ............ 294/907 |

OTHER PUBLICATIONS

EPO on EPOdoc, Jul. 30, 1996, U.S. 5540098 A (Tokyo Electron Ltd), abstract, fig. 1.

*Primary Examiner*—Dean J. Kramer
*Attorney, Agent, or Firm*—Perman & Green, LLP.

[57] ABSTRACT

A device for transferring an object between at least two locations with a gripper which grips the object at a handle element after it approaches the object with gripper elements has the aim of preventing deformation or destruction of the object during the approach of the gripper. This should minimize particle generation resulting from firm holding. The gripper has a sensor for detecting the object and its distance during approach, wherein the time at which the object is detected defines the determination of the remaining approach path for a controlled approach and the start of the gripping process.

11 Claims, 5 Drawing Sheets

DEVICE FOR THE TRANSFER OF AN OBJECT BETWEEN AT LEAST TWO LOCATIONS

BACKGROUND OF THE INVENTION a) Field of the Invention

The invention relates to a device for transferring an object between at least two locations with a gripper which grips the object at a handle element after it approaches the object with gripper elements.

b) Description of the Related Art

A device of the kind mentioned above is known from DE 195 42 646 A1.

In the fabrication of integrated circuits, the substrates to be machined are usually accommodated in transport pods or containers because of cleanroom requirements. Usually, specially constructed grippers are used for mechanical transfer of the transport containers, wherein corresponding handle elements are provided for these grippers in the cover region of the containers.

Thus it is known from DE 195 42 646 A1 to charge a loading and unloading station for a semiconductor machining device from, a storage. A vertically and horizontally movable gripper which is fastened by an extension arm to a horizontal drive is provided for transferring the transport containers which are provided with a handle element in the cover region. The horizontal drive in turn communicates with an elevator for the vertical movement. After a transport container has been gripped, it is transported horizontally out of the storage compartment into an open space and is subsequently transported vertically until reaching a plane in which a transfer is to be carried out.

In a transfer of the type mentioned above, it is particularly important that the firm holding required for quick transport does not cause increased particle generation through friction. Since the transport containers differ within determined tolerances with respect to their size, especially with respect to height, it must be ensured that no deformation or even destruction occurs as the gripper approaches the transport container.

OBJECT AND SUMMARY OF THE INVENTION

It is the primary aim of the invention to solve this problem.

According to the invention, this aim is realized by a device for transferring an object between at least two locations with a gripper which grips the object at a handle element after it approaches the object with gripper elements, wherein the gripper has a sensor for detecting the object and its distance during approach, wherein the time at which the object is detected defines the determination of the remaining approach path for a controlled approach and the start of the gripping process.

The sensor is advantageously constructed as a light barrier which has a defined distance in relation to a reference plane at the gripper and which is entered by the object as the latter approaches.

The gripper contains two pairs of plates which are adjustable relative to one another, the plates lie one on top of the other and are connected by connecting rods or couplers, the lower plate being positively guided in guides on a base plate. The upper plates carry gripper elements which laterally enclose the base plate. When moved in direction toward one another, the upper plates contact stops on the base plate so that a change in the direction of movement is effected and the gripper elements are pulled against the base plate. The gripping process with the gripper elements is composed of movements which are directed vertical to each other, wherein the gripper elements move under the handle element in a first movement and, in a second movement directed toward the gripper, contact the handle element until a frictional and positive connection is brought about between the handle element and a contact face at the gripper, which contact face lies in the reference plane. Thickness tolerances at the handle element can be compensated in that the gripper elements are constructed as spring plates.

It is advantageous when a crank drive with sensors is provided as a drive for displacing the pairs, wherein the sensors detect the respective end positions of the crank drive for trouble-free operation of the gripper.

Orientation pins arranged at the lower plates engage in recesses of the handle element to check orientation. In the case of incorrect orientation, the movement of the lower plates is prevented and the crank drive is therefore prevented from reaching the end position, so that the sensors at the crank drive send an error message. The ends of the orientation pins are expanded in a dish-shaped manner so that a positive-locking holding of the handle element can be ensured in the event of breakage of the gripper elements.

In order to facilitate the change in direction of the movement of the upper plates, the stops are provided with ball bearings for rolling.

The gripper is particularly suitable for transferring transport containers in a storage bay or shelf and is fastened to a horizontal and vertical drive for this purpose. The transfer is carried out between a transport container receptacle for manually charging the storage shelf with transport containers and shelf locations within the storage shelf. Direct transfer to a loading and unloading location for a semiconductor machining installation can also be provided.

The invention will be explained more fully hereinafter with reference to the schematic drawing.

DESCRIPTION OF THE PREFERRED EMBODIMENTS

Figure 1:
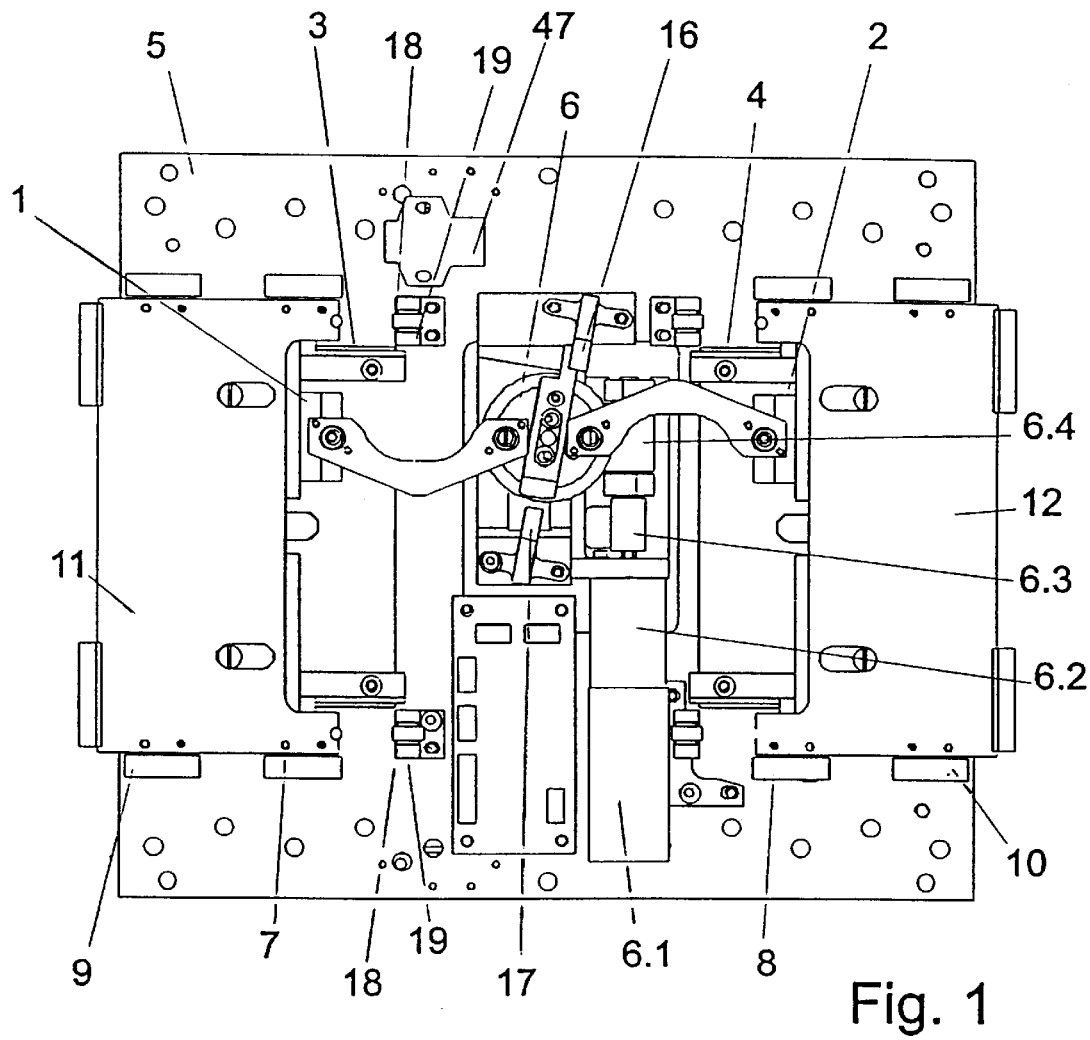
FIG. 1 is a top view showing the structural design of the gripper.
Figure 2:
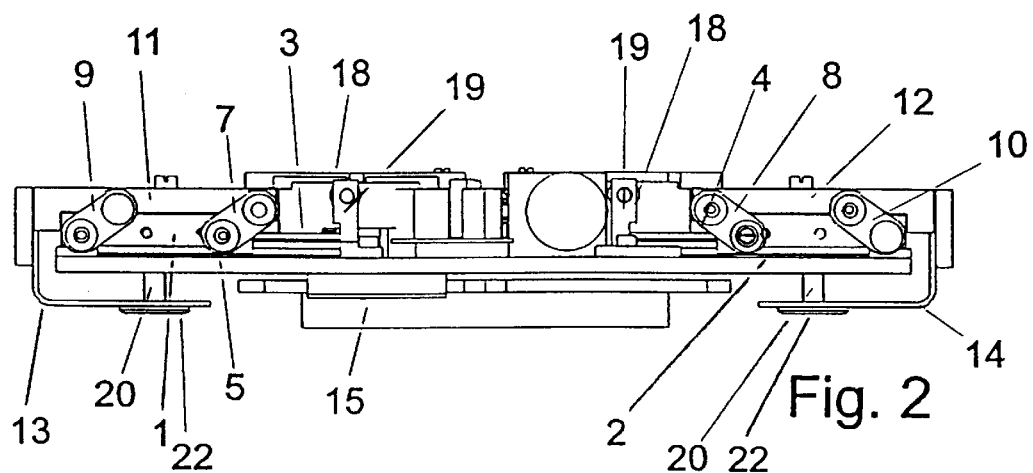
FIG. 2 is a side view of the gripper with opened gripper elements.
Figure 3:
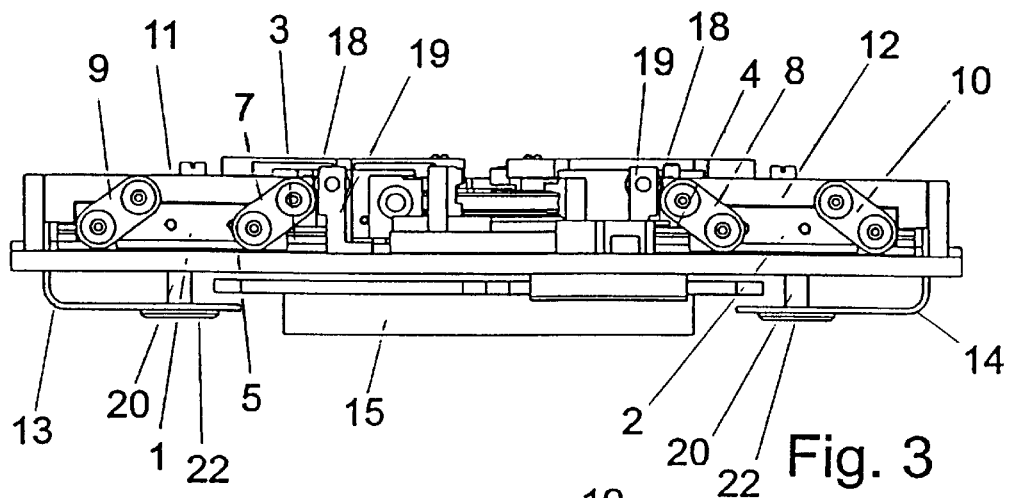
FIG. 3 is a side view of the gripper with gripper elements which are moved under a handle element.
Figure 4:
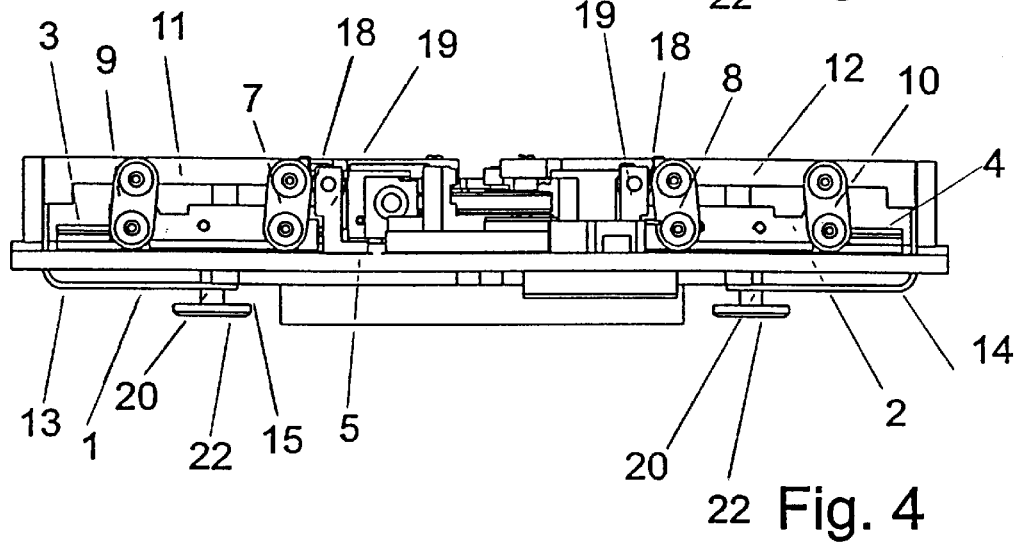
FIG. 4 is a side view of the gripper with gripped object.

In FIGS. 1 to 4, which show a gripper, lower plate-shaped coupler receivers 1, 2 are positively guided through guides 3, 4 carried by a base plate 5. A crank drive 6 is provided for driving, wherein power transmission to the crank drive 6 is carried out by a motor 6.1, via a first gear unit 6.2 and a clutch 6.3, through a worm gear unit 6.4 for generating the required torque and to achieve self-locking. In this way, the gripper cannot open automatically due to the effect of gravitational force when power is cut off. The increasing torque of the crank drive 6 has a positive effect at the end of the movement area, wherein the velocity of the path change decreases at the same speed of the drive.

Figure 5:
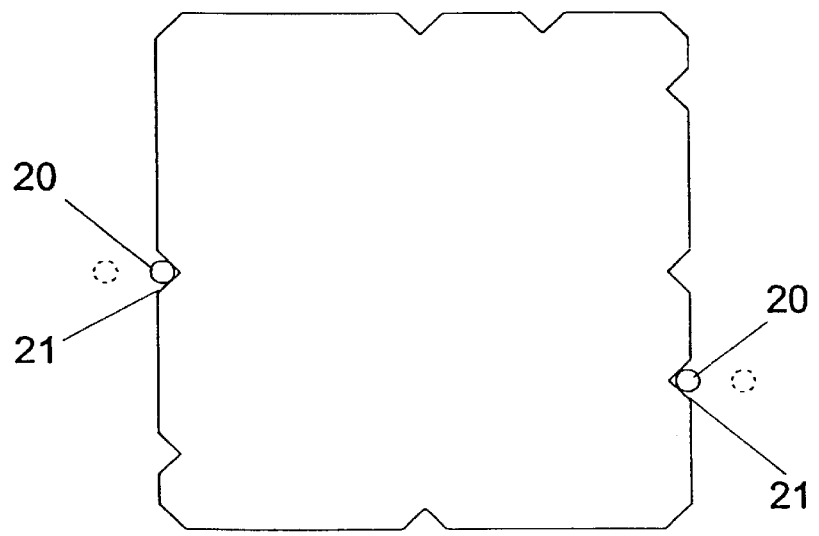
FIG. 5 shows means for aligning the handle element with the gripper.
Figure 6A:
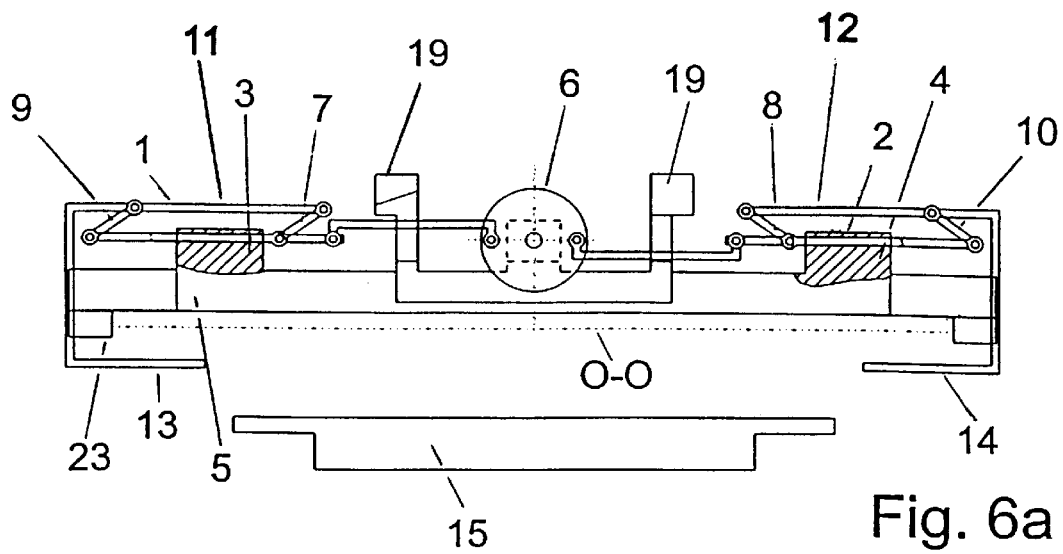
FIGS. 6a–d show a schematic illustration of the gripping process.
Figure 6B:
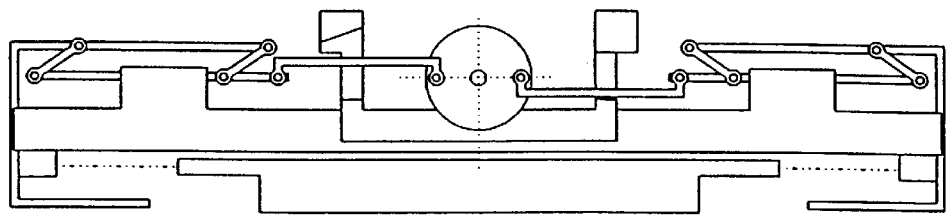
Figure 6C:
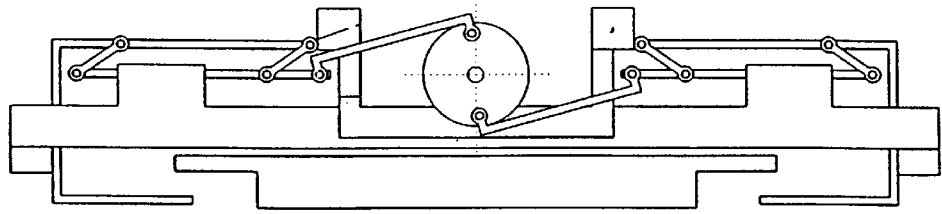
Figure 6D:
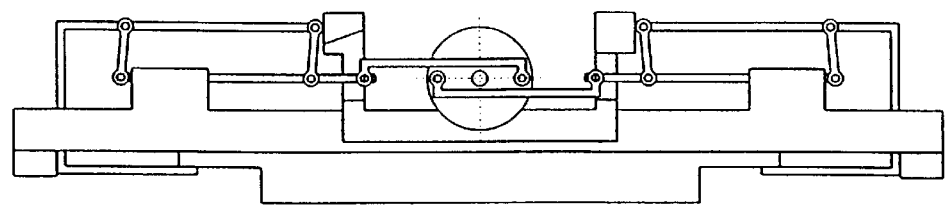

The lower coupler receivers 1, 2 are connected with upper plate-shaped coupler receivers 11, 12, which serve as carriers for gripper elements 13, 14, by means of couplers; the inner couplers are designated by 7 and 8, and the outer couplers are designated by 9 and 10. Thickness tolerances of a handle element 15 of the objects to be gripped can be compensated in that the gripper elements 13, 14 are constructed as spring plates. Sensors 16, 17 associated with the crank drive 6 detect its respective end positions for trouble-free operation of the gripper. If the corresponding end position is not reached in the selected rotating direction, an error is reported. Stops 19 provided with ball bearings 18 are fastened to the base plate 5 to limit the horizontal movement area of the upper coupler receivers 11, 12, wherein these stops 19 ensure that the upper coupler receivers 11, 12 can continue to move vertically with low friction. Further, orientation pins 20 are arranged at the lower coupler receivers 1, 2 and engage in recesses 21 of the handle element 15 for checking orientation (FIG. 5). In case of faulty orientation, the orientation pins 20 prevent the crank drive 6 from reaching the end position, which results in an error message. Dishes 22 at the end of the orientation pins 20 ensure that the handle element 15 is held in a positive engagement by the gripper in case of breakage of the spring plates.

A first sensor constructed as a light barrier 23, preferably an optoelectronic one-way light barrier, is arranged below the base plate 5, i.e., forward of the gripper in the direction of movement toward an object to be gripped. The optical axis O—O formed by the transmitter and receiver is in a fixed spatial relationship (defined distance) to the base plate 5.

While the gripper in the present embodiment example is designed for use in a horizontal position, the gripper principle can also be applied in a vertical position. This only requires the insertion of spring elements to generate a force which acts on the upper coupler receivers 11, 12 as gravitational force in horizontal application.

The object is gripped basically in accordance with a process sequence shown in FIGS. 6a–d.

Starting from an initial position in which the gripper is positioned over the handle element 15 in the x-y plane, the gripper is lowered toward the handle element 15 until its upper edge enters the light barrier 23. The interruption of the beam bundle identifies the presence of the handle element 15 and also, based on the known defined distance from the base plate 5, the free space still remaining between the base plate 5 and the handle element 15. The gripping position, in which a defined gap should be left open between the base plate 5 and the handle element 15 to prevent deformation of the object, can now be approached in a controlled manner. Further, detection of the handle element 15 is linked with a triggering of a signal for controlling the crank drive 6 whose rotation (FIG. 6c) displaces the coupler receivers 1, 2, 11, 12 together with the couplers 7, 8, 9 10 horizontally toward the center of the gripper. In this segment of the gripping process, the gripper elements 13, 14 move horizontally under the handle element 15.

When the inner couplers 7, 8 contact the stops 19 by a roller bearing of the upper coupler receivers 11, 12, their horizontal movement is stopped. Since the lower coupler receivers 1, 2 are displaced further horizontally, the couplers 7, 8, 9, 10 swing up in a compulsory manner due to the rolling process at the ball bearings 18. The horizontal movement of the upper coupler receivers 11, 12 and accordingly that of the gripper elements 13, 14 is transformed into a vertical movement.

When the crank drive 6' reaches the second dead center point (FIG. 6d) after a 180-degree rotation, the horizontal movement of the lower coupler receivers 1, 2 as well as the vertical movement of the upper coupler receivers 11, 12 with the gripper elements 13, 14 are stopped.

The gripper elements 13, 14 contact the handle element 15 before reaching the highest point of the vertical movement, so that a frictional and positive engagement results due to the occurring pretensioning. The object is lifted slightly and pressed against the base plate 5 of the gripper by the surface of the handle element 15.

Releasing is carried out in the reverse order.

Substantial advantages of the invention consist in that the object cannot be damaged when transferred by the gripper. Particle generation is minimized despite firm clamping by means of the friction-locking and positive-locking gripping because the gripper elements 13, 14 engage at the handle element 15 without relative movement of the contacting surfaces. In a particularly advantageous manner, the firm clamping ensures a high speed when transporting the object during its transfer. At the same time, excellent acceleration behavior is ensured due to the frictional engagement.

Figure 7:
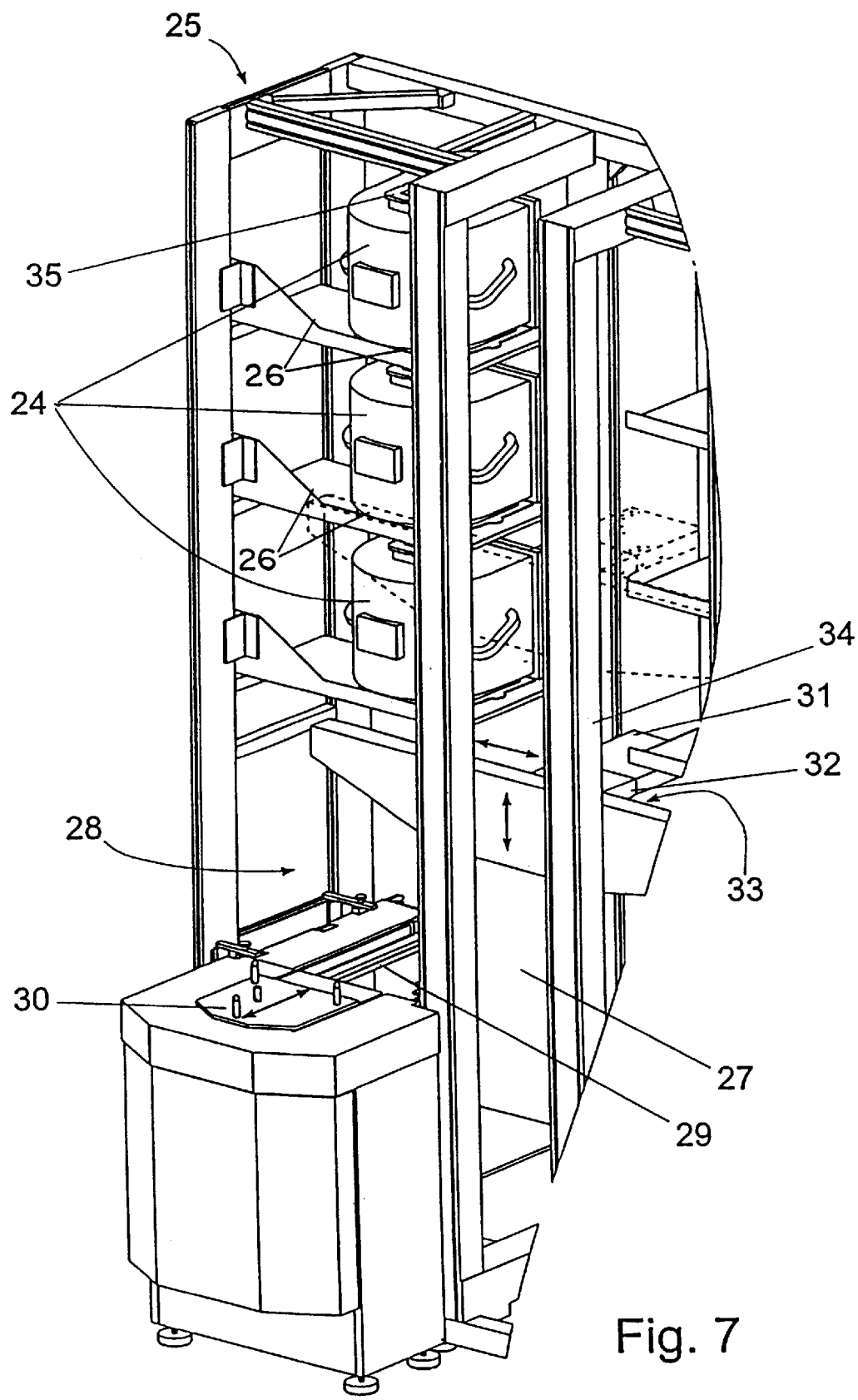
FIG. 7 shows a transfer arrangement for objects in the form of transport containers.

The use of the above-described gripper is particularly advantageous when objects in the form of transport containers 24 are to be transported in a storage shelf 25 and deposited in determined locations. The storage shelf 25 according to FIG. 7 is constructed in such a way that a plurality of shelf locations 26 are arranged adjacent to one another and one above the other.

For optional access to the transport containers 24 on the shelf locations 26, it is essential that a space 27 is left open corresponding to the size of the transport container 24.

A loading opening 28 is provided at an ergonomic height and, along with a transport container receptacle 30 which can travel out on guides 29, serves for manually loading transport containers 24 on the storage shelf 25.

In order to transfer the transport containers 24, a vertically and horizontally movable gripper 31 is provided according to the invention, wherein the gripper 31 is fastened by an extension arm 32 to a horizontal drive 33. The horizontal drive 33 is connected in turn with an elevator 34. Both drive systems 33, 34 are outfitted with a path measurement system for which reference sensors provided for both coordinates serve as reference points.

In the cover region, the transport containers 24 have a handle element 35 which is automatically gripped by the gripper 31. Enough space is left above each transport container 24 to allow the extension arm 32 with the gripper 31 to operate for the transfer.

After a transport container 24 has been gripped in the manner described with reference to FIGS. 1 to 6, it is transported horizontally from the space on the shelf locations 26 into the open space 27 and is subsequently transported vertically (and horizontally) to another deposit location, e.g., the transport container receptacle 30 or a platform, not shown, for charging a loading and unloading device for a semiconductor machining installation. When the deposit location is reached, the transport container is transferred to it. Transporting in the opposite direction takes place in a similar manner.

Figure 8:
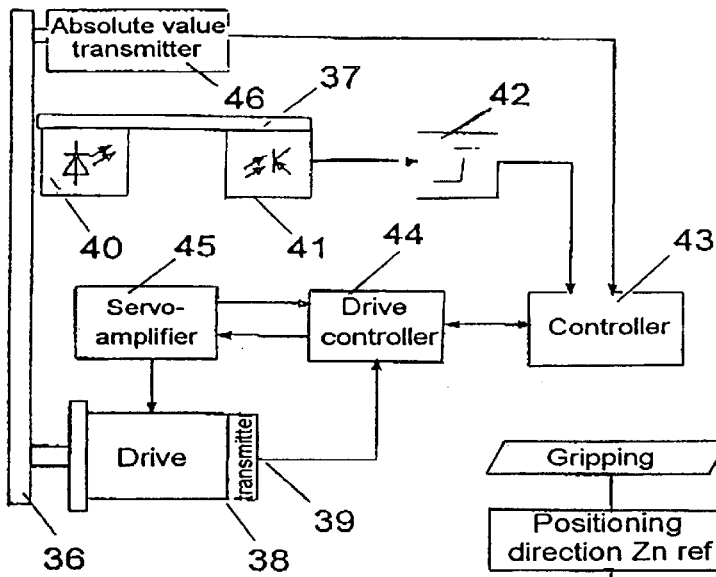
FIG. 8 is a block diagram showing the functional elements of the transfer.

For vertical driving, the functional elements of a transfer device for executing the gripping and depositing functions are shown separately in FIG. 8. A gripper 37 which is displaceable along a z-guide 36 has a drive 38 with a path measurement system 39 which determines the respective z-position that has been reached. The path measurement system 39 is preferably constructed as a rotational transmitter which determines the spatial position based on the steps executed by the drive 38. A transmitter 40 and a receiver 41 at the gripper 37 form the light barrier, by means of which an object to be gripped is detected. When the object enters the light barrier region, a switching signal is generated via a threshold switch 42 and is conveyed to a controller 43 which communicates bidirectionally with a drive controller 44 for the drive 38. Further, the drive controller 44 which receives the signals of the path measurement system 39 is bidirectionally connected with a servoamplifier 45 located at the drive 38.

The switching signal causes the controller 43 to inquire the z-position determined by the path measurement system 39 at the point in time when the object enters the light barrier. This z-position serves as a basis for determining the remaining approach path before stopping and for determining the initiation of gripping.

Since the z-positions determined at the path measurement system 39 at the drive 38 are lost after every switching-off process, it is advantageous to provide another position detection means 46 designed as an absolute measurement system. This enables the reliable positioning of the gripper in the z-coordinate after a currentless state without the need for a reference run. The alignment between the two measurement systems 39, 46 and the reference sensor which is stationary with respect to the frame can be carried out in a reference run.

Figure 9:
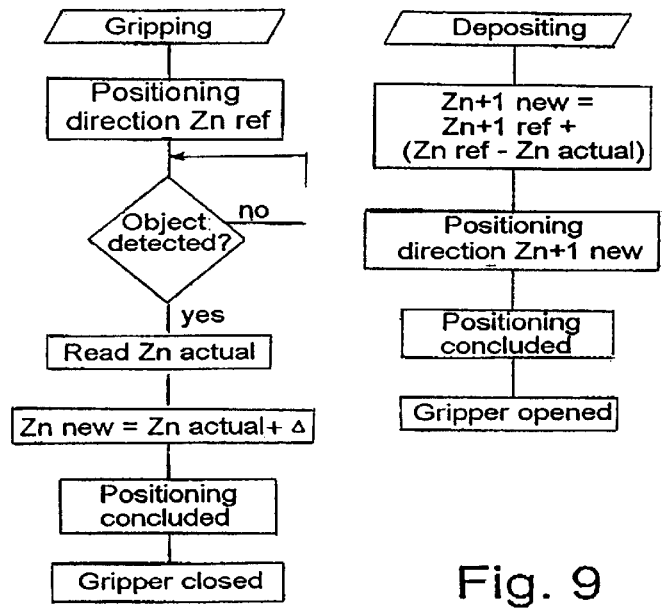
FIG. 9 shows a flow chart of the transfer of an object between two deposit locations.

The sequence of operations for gripping and depositing an object is illustrated in FIG. 9. First, the gripper is positioned over a shelf location and the movement is started in the direction of a reference position $Z_{n\ ref}$ which is determined by means of a learning process as will be described hereinafter. If an object is detected, the current or actual position $Z_n$ of the z-coordinate is read at the path measurement system and a new reference position is subsequently determined. The new reference position is composed of the determined actual position and a z-value $\Delta$ given by the distance value of the light beam bundle of the light barrier from the base plate of the gripper minus the intermediate space to be left between the base plate and the handle element at the start of the gripping process. When the new reference position is reached, the positioning is concluded and the gripper can be closed.

In order to deposit the object at another known position (shelf location), the actual height of the object which has already been determined during the positioning in the gripping process is taken into account in that this actual height is determined by subtraction from the coordinates of the rack or tier position in the shelf and the gripper position at the point in time that the object is detected during the gripping process. The gripper position for the subsequent depositing is calculated through addition from the tier position and the object height. The coordination or correlation of the tier positions which are fixed with respect to the frame is carried out by means of a two-dimensional matrix in the x and z coordinates. The above-described manner of operation can prevent deformation and can prevent the object from falling out. The gripper is opened when positioning is concluded.

Figure 10:
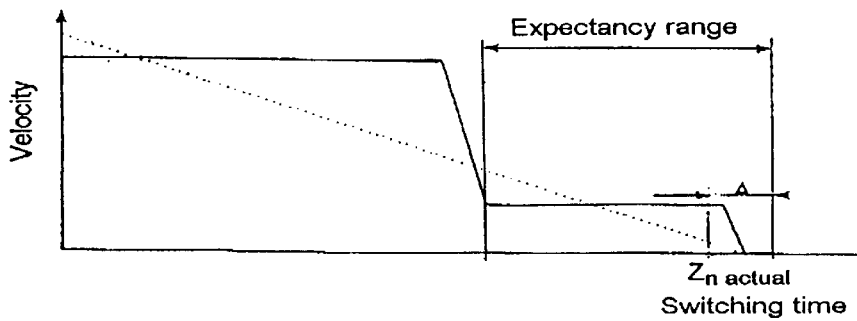
FIG. 10 illustrates the speed control during the transfer process.

In most cases, the objects to be gripped have a defined height which, however, can have tolerances due to techniques employed in their manufacture. An expectation range (FIG. 10) can be defined for the objects for the purpose of optimizing the receiving process with respect to time. Beyond this range, the gripper can be moved at high speed; within this range, the speed is reduced, first to a medium speed and then, after detection of the object (switching time) and after the residual path is traveled, to zero, for the purpose of increased accuracy in position detection.

A further possibility for optimizing the receiving process with respect to time while simultaneously improving the dynamic behavior consists in the selection of the braking acceleration (dashed line), so that the required speed is reached in the expectation range.

An object of known size, e.g., a transport container 26, is used for measuring the spatial arrangement of the individual shelf locations in the learning process. The actual positions for the shelf locations are determined by means of the path measurement systems at the drives based on reference positions from the manufacturer's specifications. The object is first deposited on a shelf location by means of the gripper. Subsequently, during a z-movement of the gripper, the position of the gripper is determined at the switching time of the light barrier and is stored in a matrix.

The position of the objects in the x-y plane is usually determined by centering pins on the shelf locations and corresponding mating pieces (conical recesses) in the rest surfaces of the objects. For the purpose of determining the x-position of the respective placement location, a second sensor 47 is provided at the gripper, wherein the effective direction of the sensor 47 lies in the x-direction. The position of the object can be determined in combination with the path measurement system for the x-direction. The second sensor is preferably constructed as a reflex sensor, so that the x-movement of the gripper can be carried out at a sufficiently great distance from the object for preventing collisions. In order to increase accuracy, the object can be measured from two directions so that the center can be determined.

When the shelf location is measured, the gripper transports the known object to the next shelf location and the z-position and x-position are determined and stored in the above-mentioned matrix. The measurement of the storage shelf can be carried out automatically in this way.

If required, it is possible to expand the principle to a third coordinate when a y-drive is installed with a corresponding path measurement system.

While the foregoing description and drawings represent the preferred embodiments of the present invention, it will be obvious to those skilled in the art that various changes and modifications may be made therein without departing from the true spirit and scope of the present invention.

What is claimed is:

1. Device for transferring an object between at least two locations comprising:
   a gripper for gripping the object at a handle element, the gripper comprising gripper elements, each gripper element being adapted to move under the handle element in a first movement and toward the gripper in a subsequent second movement, the second movement causing the gripper elements to contact the handle element and press the object against a plate of the gripper until a frictional contact is brought about between the object and the plate;

said gripper having a sensor for detecting the object and its distance during approach; a time at which the object is detected defining determination of the remaining approach path for a controlled approach and start of a gripping process.

2. The device according to claim 1, wherein the sensor is constructed as a light barrier which has a defined distance in relation to a reference plane at the gripper and which is entered by the object as the latter approaches.

3. The device according to claim 1, wherein the gripper is fastened to a horizontal and a vertical drive for the purpose of transferring transport containers in a storage shelf and the transfer is carried out between a transport container receptacle for manually charging the storage shelf with transport containers and shelf locations within the storage shelf.

4. The device according to claim 3, wherein direct transfer to a loading and unloading location is provided for a semiconductor machining installation.

5. Device for transferring an object between at least two locations comprising:

a gripper for gripping the object at a handle element after it approaches the object with gripper elements;

the gripper containing two pairs of plates which are adjustable relative to one another, wherein the plates lie one on top of the other and are connected by couplers, the lower plate being positively guided in guides on a base plate, and the upper plates carry gripper elements which laterally enclose the base plate, and in that, when moved in direction toward one another, the upper plates contact stops on the base plate so that the direction of movement is changed and the gripper elements are pulled against the base plate;

the gripper having a sensor for detecting the object and its distance during approach; a time at which the object is detected defining determination of the remaining approach path for a controlled approach and start of a gripping process, the sensor being constructed as a light barrier which has a defined distance in relation to a reference plane at the gripper and which is entered by the object as the latter approaches.

6. The device according to claim 5, wherein the gripping process with the gripper elements is composed of movements which are directed vertical to each other, wherein the gripper elements move under the handle element in a first movement and, in a second movement directed toward the gripper, contact the handle element until a frictional and positive connection is brought about between the handle element and a contact face at the gripper, which contact face lies in the reference plane.

7. The device according to claim 6, wherein the gripper elements are constructed as spring plates.

8. The device according to claim 7, wherein a crank drive with sensors is provided as a drive for displacing the pairs, wherein the sensors detect the respective end positions of the crank drive for trouble-free operation of the gripper.

9. The device according to claim 8, wherein orientation pins are arranged at the lower plates and engage in recesses of the handle element as an orientation check, and, in case of incorrect orientation, the crank drive is prevented from reaching the end position, so that the sensors at the crank drive report an error.

10. The device according to claim 9, wherein the ends of the orientation pins are expanded in a dish-shaped manner so that a positive-locking holding of the handle element can be ensured in the event of breakage of the gripper elements.

11. The device according to claim 10, wherein the stops are provided with ball bearings for rolling to facilitate the change in direction of the movement of the upper plates.

* * * * *